United States Patent
Carlson

(10) Patent No.: US 11,456,139 B2
(45) Date of Patent: Sep. 27, 2022

(54) TRIP FREE RELAY

(71) Applicant: ROCKWELL AUTOMATION TECHNOLOGIES, INC., Mayfield Heights, OH (US)

(72) Inventor: Andrew Edward Carlson, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/182,407

(22) Filed: Feb. 23, 2021

(65) Prior Publication Data

US 2021/0175037 A1    Jun. 10, 2021

Related U.S. Application Data

(63) Continuation of application No. 15/782,522, filed on Oct. 12, 2017, now Pat. No. 10,930,462.

(51) Int. Cl.
| | | |
|---|---|---|
| *H01H 73/44* | (2006.01) | |
| *H01H 71/32* | (2006.01) | |
| *H01H 71/62* | (2006.01) | |
| *H01H 71/58* | (2006.01) | |
| *H01H 50/32* | (2006.01) | |
| *H01H 51/22* | (2006.01) | |
| *H01H 71/68* | (2006.01) | |
| *H01H 1/58* | (2006.01) | |
| *H05K 1/18* | (2006.01) | |

(52) U.S. Cl.
CPC .......... *H01H 73/44* (2013.01); *H01H 50/326* (2013.01); *H01H 51/2227* (2013.01); *H01H 51/2272* (2013.01); *H01H 71/323* (2013.01); *H01H 71/58* (2013.01); *H01H 71/62* (2013.01); *H01H 71/68* (2013.01); *H01H 1/5805* (2013.01); *H05K 1/18* (2013.01)

(58) Field of Classification Search
CPC ............. H01H 51/2227; H01H 50/326; H01H 51/2272; H01H 71/323; H01H 71/58; H01H 71/62; H01H 71/68; H01H 73/44; H01H 1/5805; H05K 1/18
See application file for complete search history.

(56) References Cited

U.S. PATENT DOCUMENTS

| | | |
|---|---|---|
| 1,988,287 A | 1/1935 | Thumim |
| 1,999,410 A | 4/1935 | Graves, Jr. et al. |
| 3,783,422 A | 1/1974 | Taylor |
| 5,332,986 A | 7/1994 | Wieloch |

(Continued)

FOREIGN PATENT DOCUMENTS

| | | |
|---|---|---|
| CN | 2819445 Y | 9/2006 |
| CN | 102024628 A | 4/2011 |

(Continued)

*Primary Examiner* — Mohamad A Musleh
(74) *Attorney, Agent, or Firm* — Fletcher Yoder, P.C.

(57) ABSTRACT

An overload relay is disclosed in which a single operator coil is controlled for both tripping and resetting. A permanent magnet and a spring make the device bi-stable, so the coil may be unpowered when in the trip and reset states. Energization of the coil overcomes the magnet to allow tripping, while energization in an opposite direction adds to the magnet force to reset the device. An electromagnetic activation path overrides a mechanical activation path for electromagnetic tripping despite attempted manual resetting. The device may be pulse width modulated to reduce power consumption.

20 Claims, 11 Drawing Sheets

(56) References Cited

U.S. PATENT DOCUMENTS

| | | |
|---|---|---|
| 5,956,221 A | 9/1999 | Zuzuly et al. |
| 2006/0158813 A1 | 7/2006 | Peng et al. |
| 2011/0057750 A1 | 3/2011 | Suzuki et al. |

FOREIGN PATENT DOCUMENTS

| | | |
|---|---|---|
| CN | 205789794 U | 12/2016 |
| EP | 3185272 A1 | 6/2017 |

TRIP FREE RELAY

CROSS REFERENCE TO RELATED APPLICATION

This application is a continuation of and claims priority to U.S. application Ser. No. 15/782,522 entitled "TRIP FREE RELAY," filed Oct. 12, 2017, which is herein incorporated by reference in its entirety.

BACKGROUND

The invention relates generally to electromechanical switching devices, and in particular to trip free overloads, such as those used in industrial automation applications.

A wide range of switching devices have been developed and are currently in use for powering loads, such as motors and other actuators in industrial automation settings. One class of such devices comprises overload relays. Such relays are often used in conjunction with other switching and protective devices upstream of loads connected to a power supply such as the grid. Overload relays may allow for detecting of currents, and opening or tripping if currents or heating rise to undesirable levels. In many motor applications, such overload relays provide separate switching control for three phases of power, although single phase devices are also common.

In many settings, it may be desirable to allow for tripping and resetting of overload relays both electromagnetically and manually. That is, when the circuit is to be opened, the devices should be capable of actuating to provide the desired open circuit in an automatic way by energizing or de-energizing an operator coil. Similarly, it may be desired to reset the device to a conductive state electromagnetically so that remote operation is possible, as well as automated operation. For manual actuation, a trip or test button may be provided to open the device. To manually reset the device to a conductive state, then, a reset button may be provided.

Although devices have been designed to offer both types of actuation, these commonly require manual setting to a different physical configuration or mode. This mode selection reduces the utility of the device, and increases its complexity. Other issues with available overload relays include the avoidance of manual resetting when tripping is desired (that is, making the device free to trip, or "trip free" despite actions of a human operator). Still further, existing devices may require considerable power for operation.

There is a need, therefore, for overload relays and similar electromagnetic switches that allow for ease of use both electromagnetically and manually. There is a particular need for a bi-stable device of this type that can use less energy by de-energizing and operator coil when desired. Moreover, there is a need for such devices that prevent manual resetting when electromagnetic tripping is activated, thereby preventing an operator from forcing the device to a conductive state. Still further, there is a need for devices of this type that provide highly efficient electromagnetic actuation with reduced power requirements.

BRIEF DESCRIPTION

In accordance with certain aspects of the present disclosure, an overload relay, comprises an electromagnetic activation path comprising an armature that, in operation, moves contacts between set and tripped states, a magnet to hold the armature in the set state, and a coil to overcome the magnet to release the armature to the tripped state under the influence of a spring, and a mechanical activation path comprising a manually operated reset member that causes the armature to move between the tripped and set states. The electromagnetic activation path and the mechanical activation path can both move the armature between the set and tripped states without selection of a mode of operation. When the coil is energized to overcome the magnet, manual operation of the reset member will not cause resetting of the armature to the set state.

In accordance with other aspects of the disclosure, an overload relay comprises an armature that, in operation, moves contacts between set and tripped states, a magnet to hold the armature in the set state, and a single coil energizable in a first manner to attract the armature to the set state, and in a second manner to overcome the magnet to release the armature to the tripped state under the influence of a spring. A mechanical activation path comprises a manually operated reset member that causes the armature to move between the tripped and set states. The armature is bistable in the set and tripped states. The electromagnetic activation path and the mechanical activation path can both move the armature between the set and tripped states. When the coil is energized to overcome the magnet, manual operation of the reset member will not cause resetting of the armature to the set state.

In accordance with other aspects, an overload relay, comprises an electromagnetic activation path comprising an armature that, in operation, moves contacts between set and tripped states, a magnet to hold the armature in the set state, and a coil to overcome the magnet to release the armature to the tripped state under the influence of a spring. A mechanical activation path comprising a manually operated reset member that causes the armature to move between the tripped and set states. The armature is bistable in the set and tripped states, and the electromagnetic activation path and the mechanical activation path can both move the armature between the set and tripped states while in the same physical configuration.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
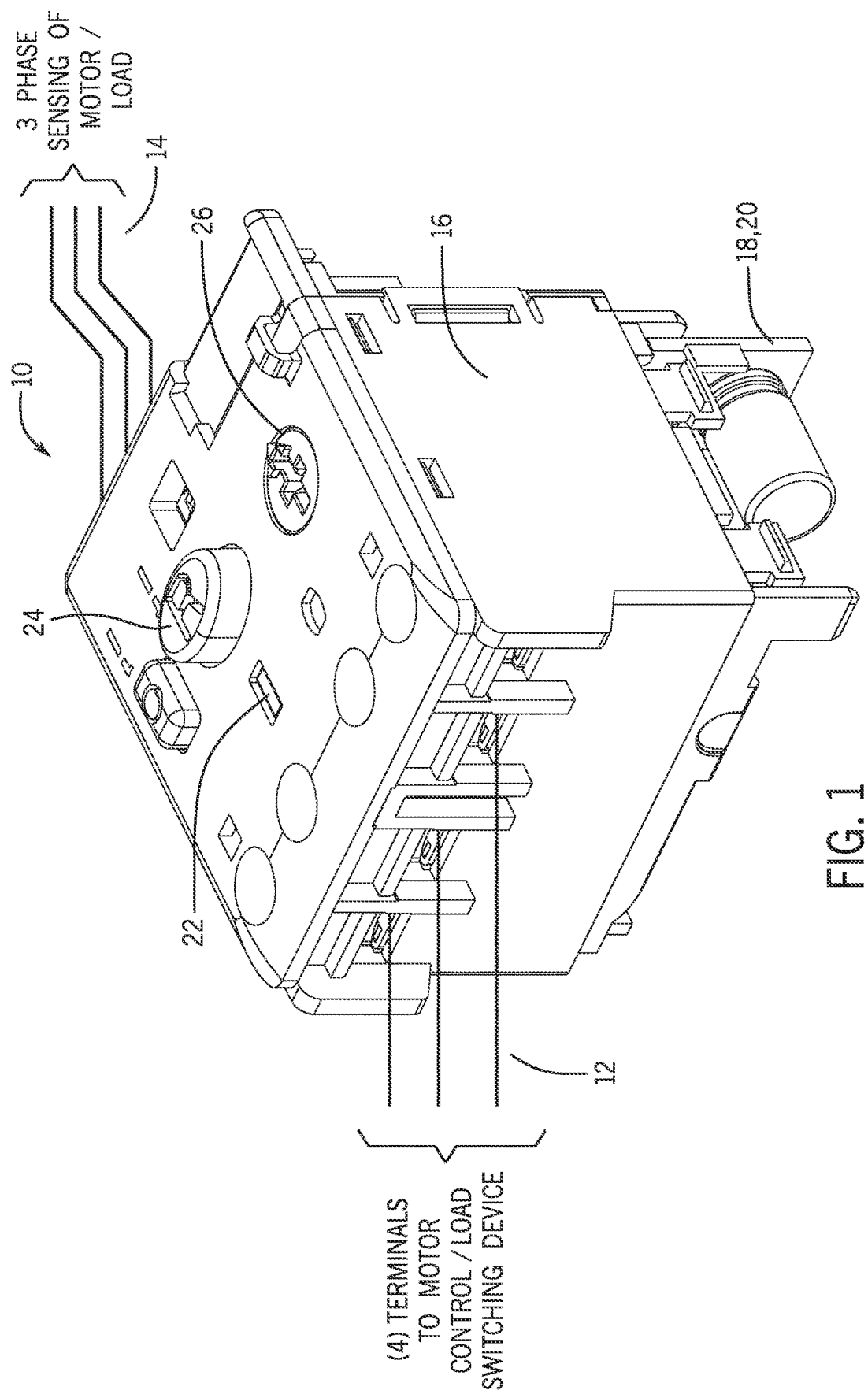
FIG. 1 is a perspective view of an exemplary overload relay in accordance with the disclosure.

An exemplary embodiment of a trip free overload relay is illustrated in FIG. 1. As shown, the relay 10 is designed for implementation in an automation system for powering loads, such as electric motors. The relay in this embodiment is a three-phase device that may be wired for normally open or normally closed operation. The relay receives input power via terminals as illustrated, from any desired source of power, such as the grid, is indicated by reference numeral 12 in the figure, such as through sensing lines. Power passes through load sensors and is provided to downstream circuitry, and ultimately to a load as indicated by reference numeral 14.

The relay comprises an external housing 16 in which all functional mechanical components and electromagnetic circuitry are position. In the illustrated embodiment, though not separately shown, the relay comprises current sensing circuitry 18 that, in operation, senses current of the phases of power entering the device for monitoring and control of possible overloads. Control circuitry 20 is also included to allow tripping of the overload relay when excessive currents are detected, or excessive currents over a certain time, or heating resulting from such currents. It should be noted that the relay may comprise digital controls, such as analog-to-digital converters, microprocessors or similar processing devices, and associated memory circuitry. Memory circuitry may store routines implemented by the relay a through execution on the processing circuitry. The control circuitry may also allow for remote control of the overload relay, such as under commands from an external device such as an automation controller. Moreover, the control circuitry may include communications circuitry allowing the overload relay to be networked and receive and/or send data, such as relating to trip events, current levels, and so forth.

Certain manual controls are accessible from outside the enclosure 16. In the illustrated embodiment these include a trip button 22 allowing for manual tripping or testing of the device operation. A reset button 24 allows for manual resetting of the relay as discussed below. An adjustment 26 is provided to set a trip current.

Figure 2:
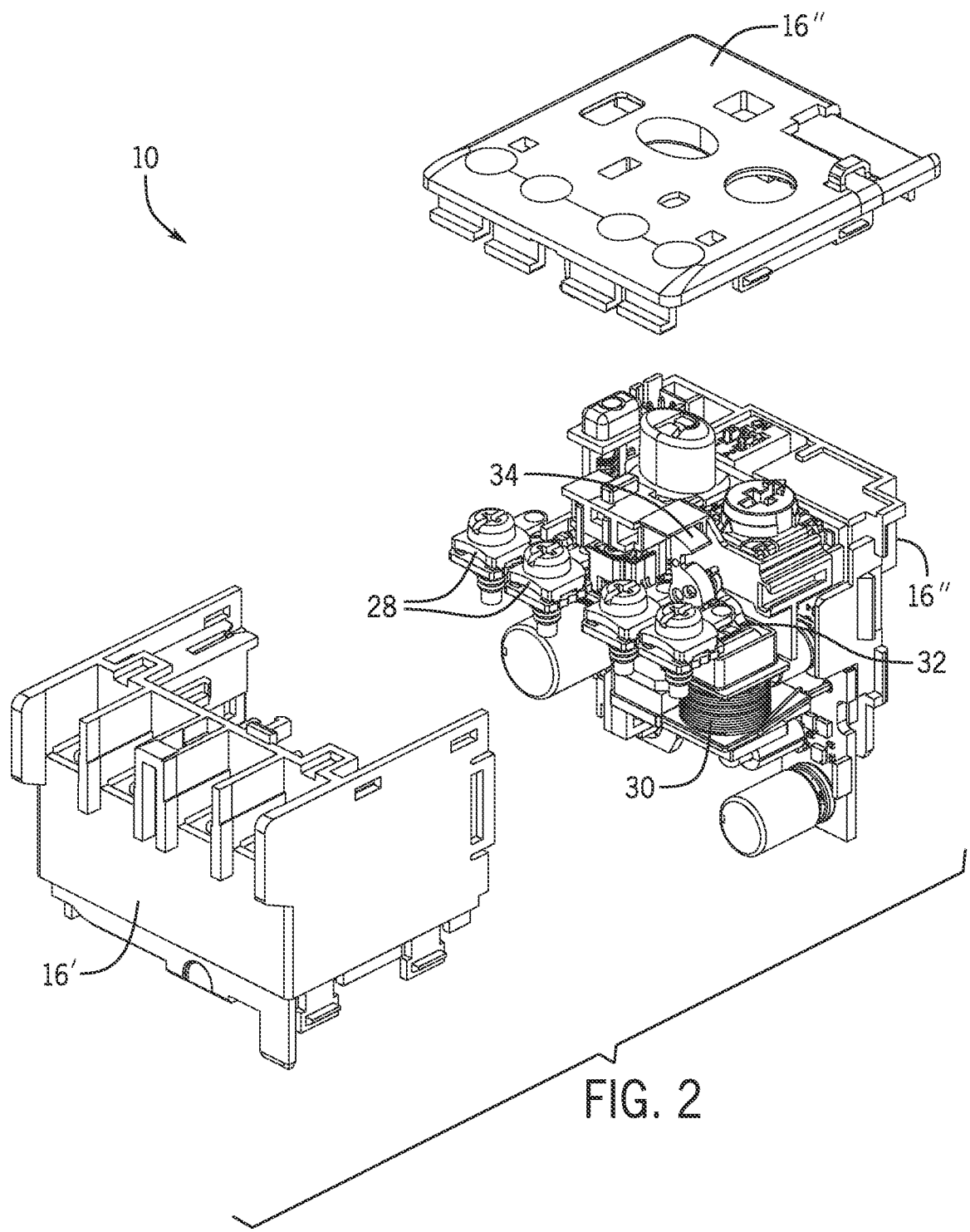
FIG. 2 is a partially exploded view of the overload relay of FIG. 1.

FIG. 2 is a partially exploded view of the overload relay showing certain internal components. In this view, the housing has been separated out as indicated by reference numerals 16', 16", and 16"'. Terminals 28 can be seen for wiring the relay in normally open normally closed configurations. Among the functional components visible in FIG. 2, an operator coil 30 is shown disposed adjacent to a movable structure 32, described in more detail below. Operation of the coil allows for both opening and closing of the device, or more specifically shifting the device between set and tripped states. It may be noted that a single coil is used for both operations, reducing parts and power needs. Also called out in FIG. 2 is a trip indicator 34 which is a mechanical flag moved upon tripping and resetting of the device.

Figure 3:
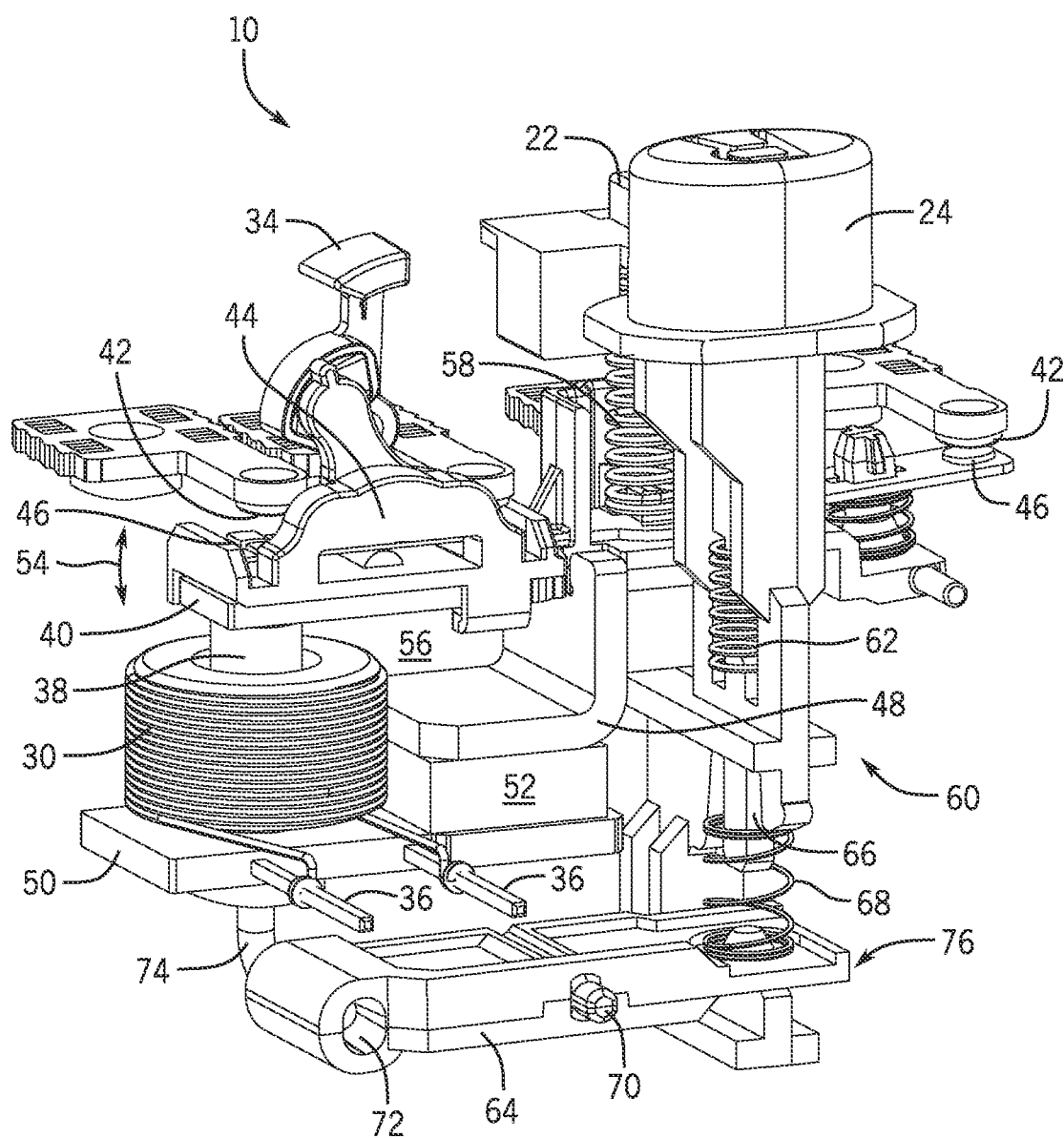
FIG. 3 is a more detailed perspective view of the operational components of the overload relay.

FIG. 3 is a perspective view showing components of the overload relay in greater detail. As shown, the coil 30 is coupled to coil power conductors 36 to receive power for electromagnetic operation in tripping and resetting. As discussed below, in certain present embodiments, the same coil is powered both for tripping and resetting, and in at least one of these modes by pulse width modulated power from the control circuitry. A central core 38 is provided through the coil. The coil and core, when energized, operate to attract or draw and armature 40 downwardly in a pivoting operation to set or reset the relay. Powering in an opposite polarity operates to trip the device as described below. Stationary contacts 42 will be hard-wired to conductors that control the operation of the motor or load. A movable contact support 44 is provided on the armature 40, and supports movable contacts 46 which, when the device is placed in a set or reset state, contact the stationary contacts to conduct power. When the device is tripped, on the other hand, the movable contacts are separated from stationary contacts to provide an open circuit.

The movable contact support and movable contacts are mounted on a pivot plate 48 which provides a pivot point about which the armature 40 pivots during operation, that is, movement between the set and tripped states. The pivot plate 48, along with the coil, is supported on a base 50. A permanent magnet 52 is disposed between the pivot plate 48 and the base 50 for holding the relay in a set state, making the device bi-stable, as discussed below. Energizing the coil in two different polarities allows for pivoting of the movable structure, including the armature 40, the support 44, and the movable contacts 46 as indicated by arrow 54 in the figure. The components just described may be considered as defining electromagnetic activation path 56 that includes the magnet 52, the coil 30, the core 38, and the armature 40. As described below, these components allow for electromagnetic tripping and resetting of the device.

A reset assembly 60 allows for manual reset. In the illustrated embodiment this reset assembly comprises a reset return spring 62 that urges the reset button 24 towards an upward orientation in the illustration. The button can be depressed against the spring force of the reset return spring 62 and then upon release is returned to its original position. A reset lever 64 is pivotable to bring about resetting of the device manually as discussed below. An extension 66 from the reset assembly receives a trip prevention spring 68 that is disposed between the reset button 24 and the reset lever 64. The trip prevention spring 68 serves to prevent manual reset when electromagnetic tripping is commanded, making the device "trip free". That is, as discussed below, the trip prevention spring allows for free movement of the reset button while the relay is in the set state. It also provides force on the reset lever 64 to move the reset pin 74 when the relay is in the tripped state. In the illustrated embodiment the reset lever 64 has a pivot pin or axis 70 about which it pivots in operation. A reset pin aperture 72 is provided at an end of the lever opposite the trip prevention spring, and receives a reset pin 74. The reset pin extends from this aperture up through the coil core and may contact the armature 40 as discussed below. The reset pin is made of a ferromagnetic material that allows for magnetic coupling with the armature to draw the device manually back into a set state, also discussed below. The assembly of components for manually tripping and resetting the device may be considered a mechanical activation path 76 that operates in parallel with the electromagnetic activation path 56 to allow manual shifting of the device between the trip and set states.

FIGS. 4 through 8 illustrate the physical positions and relationships between the components of the overload relay in different states of operation. It should be noted, however, that due to the mechanical construction of the device, the same physical configuration allows for four operations, including electromagnetic tripping, electromagnetic resetting, manual tripping, and manual resetting. Moreover, manual attempts to reset the device are overridden by electromagnetic tripping as discussed below. In the present context, the term, the "same physical configuration", is intended to imply that the components are assembled and remain in their assembled relationships (though some of them move to switch the states between set and tripped), despite whether the overload relay is operated by activation of the electromagnetic activation path or the mechanical activation path. Thus, unlike existing relays in which a mode of operation must be selected to alter a physical configuration of the device, no such mode selection is required between automatic and manual operation.

Figure 4:
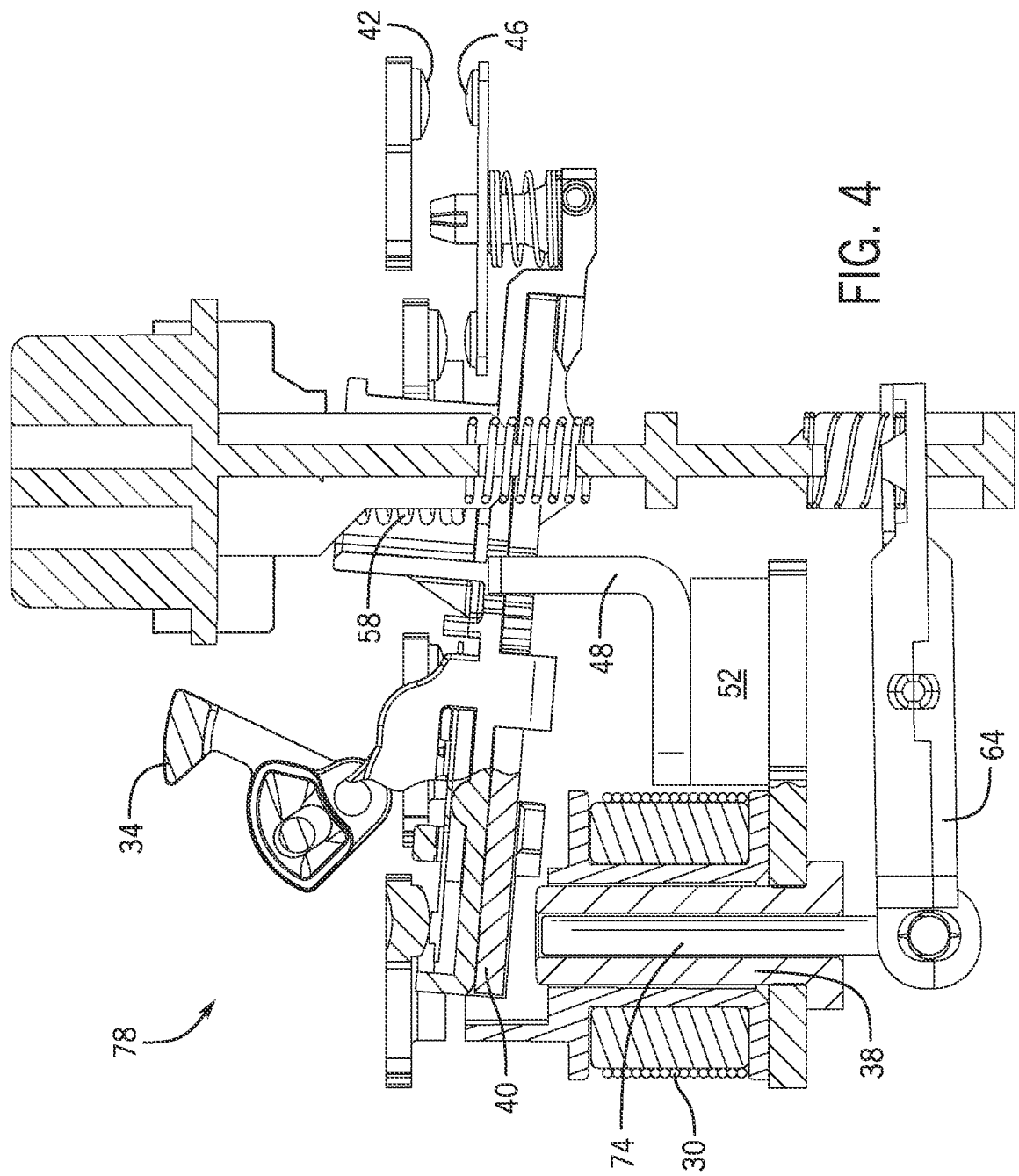
FIG. 4 is a partially sectioned side view of the overload relay further illustrating its parts and their orientation in a tripped state.

FIG. 4 illustrates the functional components of the overload relay in a tripped state. The components of the relay are the same as those described above with reference to FIG. 3. In the tripped state, indicated generally by reference numeral 78, the movable structure comprising the armature 40, is pivoted on the pivot plate 48 to separate the movable contacts 46 from the stationary contacts 42. This effectively opens the circuit through the device. In this state, the magnet 52, always creating magnetic flux, is insufficiently attractive to cause the armature 40 to pivot downwardly. In particular, the design of the toggle spring 58 (e.g., its length, travel, and spring constant) and its location with respect to the pivot point, along with the properties and placement of the magnet 52, result in application of a force on the structure to overcome any attractive force of the magnet. Also, the reset pin 54 is shown spaced from the armature so that these two components are magnetically decoupled. Owing to the relationships between the forces, and particularly to the force applied by the device is stable in this tripped state, and the coil need not be energized. Where desired, it may be possible to power the coil 30 to further overcome any attractive force resulting from the flux of magnet 52, to assist in maintaining the device in the tripped state shown.

Figure 5:
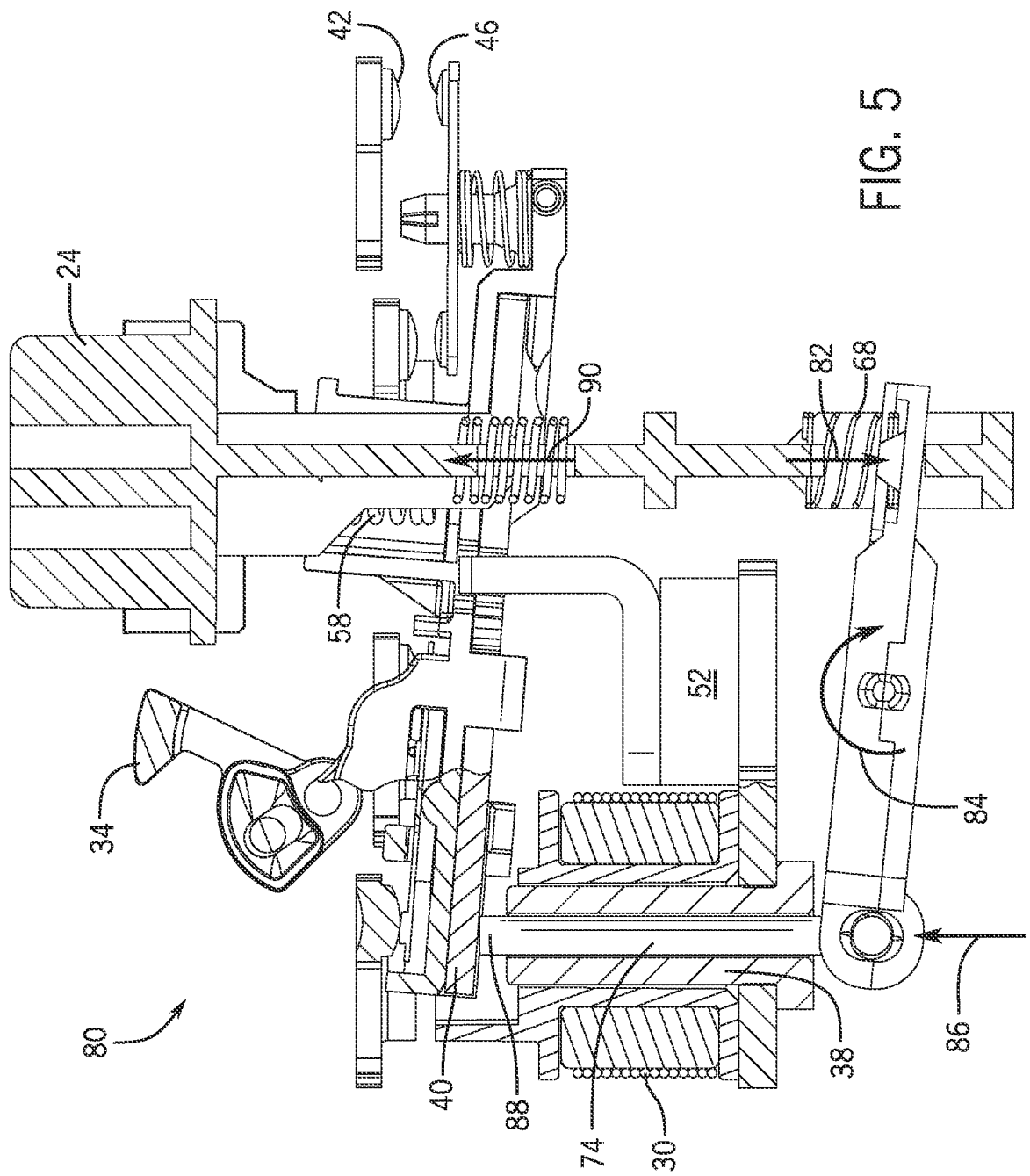
FIG. 5 is a similar illustration of the overload relay in a reset button pushed and tripped state.
Figure 6:
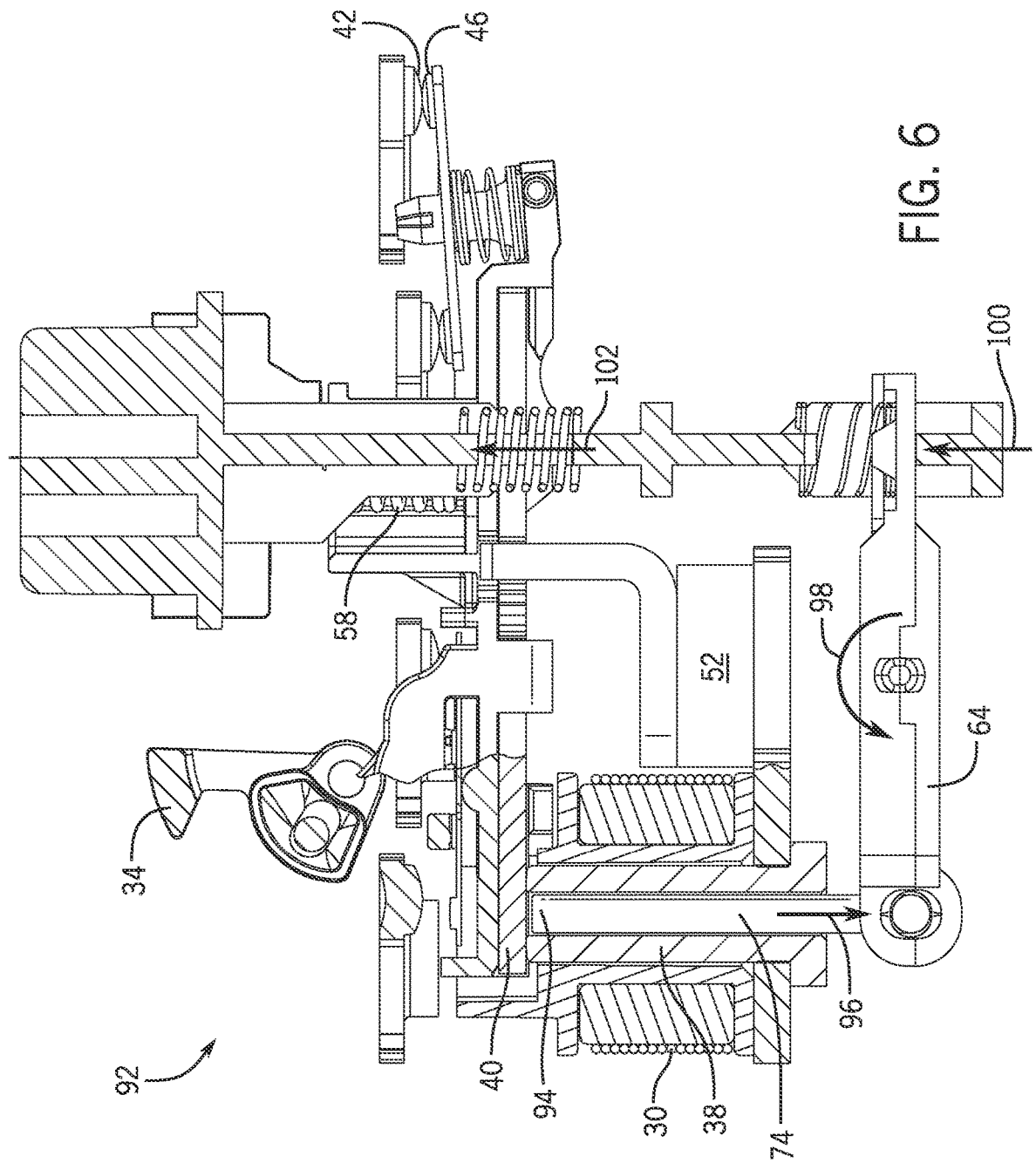
FIG. 6 is a similar illustration with the overload relay in a reset complete or set state.

The relay may be manually reset as illustrated in FIG. 5. Manual resetting, indicated generally by reference numeral 80, begins with depression of the reset button 24. This causes the reset assembly to be urged downwardly. This downward movement, indicated by arrow 82, causes rotation of the reset lever from force of the trip prevention spring 68 as indicated by arrow 84, raising the opposite end connected to the reset pin, as indicated by arrow 86. This, in turn, causes the reset pin to rise through the coil core, and contact or come into close proximity with the armature 40. This magnetically couples the pin to the armature, allowing it to draw the armature back into a reset position as shown in FIG. 6. It should be noted that depression of the reset button 24 compresses the reset return spring as indicated by reference numeral 90 in FIG. 5. After complete reset, in the components are in the set state 92 illustrated in FIG. 6. As shown, the pin 74 is returned to its retracted position although still in contact with or in close proximity to the armature 40 as indicated by reference 94. As the pin is moved downwardly, as indicated by arrow 96, the lever 64 is pivoted as indicated by arrow 98, and the opposite end of the lever is raised as indicated by reference numeral 100. This return of the components to their set state positions is caused by the extension of the reset return spring is indicated by reference numeral 102 in the figure. The trip indicator 34 is also returned to indicate the set state. Owing to the continued magnetically attractive force of the magnet, the assembly remains stably in the state, and the coil need not be powered.

It should be noted that the set state 92 may also be obtained by powering the coil 30 for electromagnetic resetting. In particular, without depression of the reset button, powering the coil in a first polarity adds to the force of the permanent magnet by virtue of flux developed by the coil and its core 38. This combined magnetic and electromagnetic flux, and the resulting forces attract the armature 40 and overcome the force of the toggle spring 58, allowing the device to be electromagnetically reset. The ultimate state following electromagnetic reset is, then, identical to that shown in FIG. 6, and the device will remain stably in this trip state.

Figure 7:
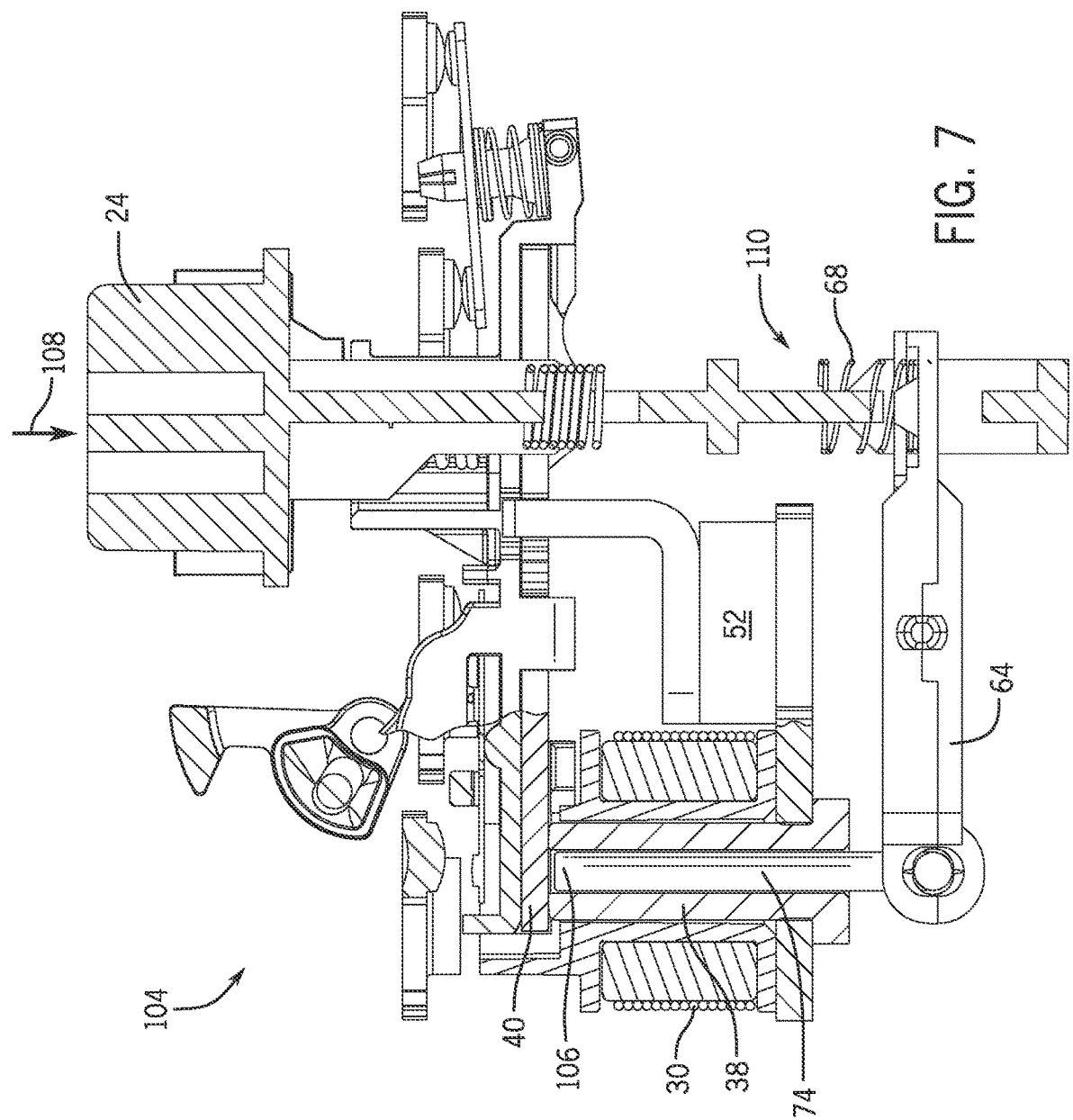
FIG. 7 is a similar illustration showing operation of a trip prevention spring.

FIG. 7 illustrates how the device avoids problems with attempted manual operation from the set state. The trip prevention state 104 occurs when the device is in the set state shown, and the reset button 24 is then depressed. In this state, the armature 40 is magnetically coupled to the pin 74 under the influence of the magnet 52, as indicated by reference 106. When the reset button 24 is then depressed as indicated by reference 108, the trip prevention spring 68 is compressed as indicated by reference 110. This compression prevents pivoting of the lever 64 that would otherwise raise the armature and move the movable structure towards a tripped state. The physical characteristics of the trip prevention spring 68 (e.g., its links, travel and spring constant) are selected so that depression of the reset button 24 does not cause a force on the lever 64 sufficient to overcome the magnetic coupling of the magnetic components to the armature.

Figure 8:
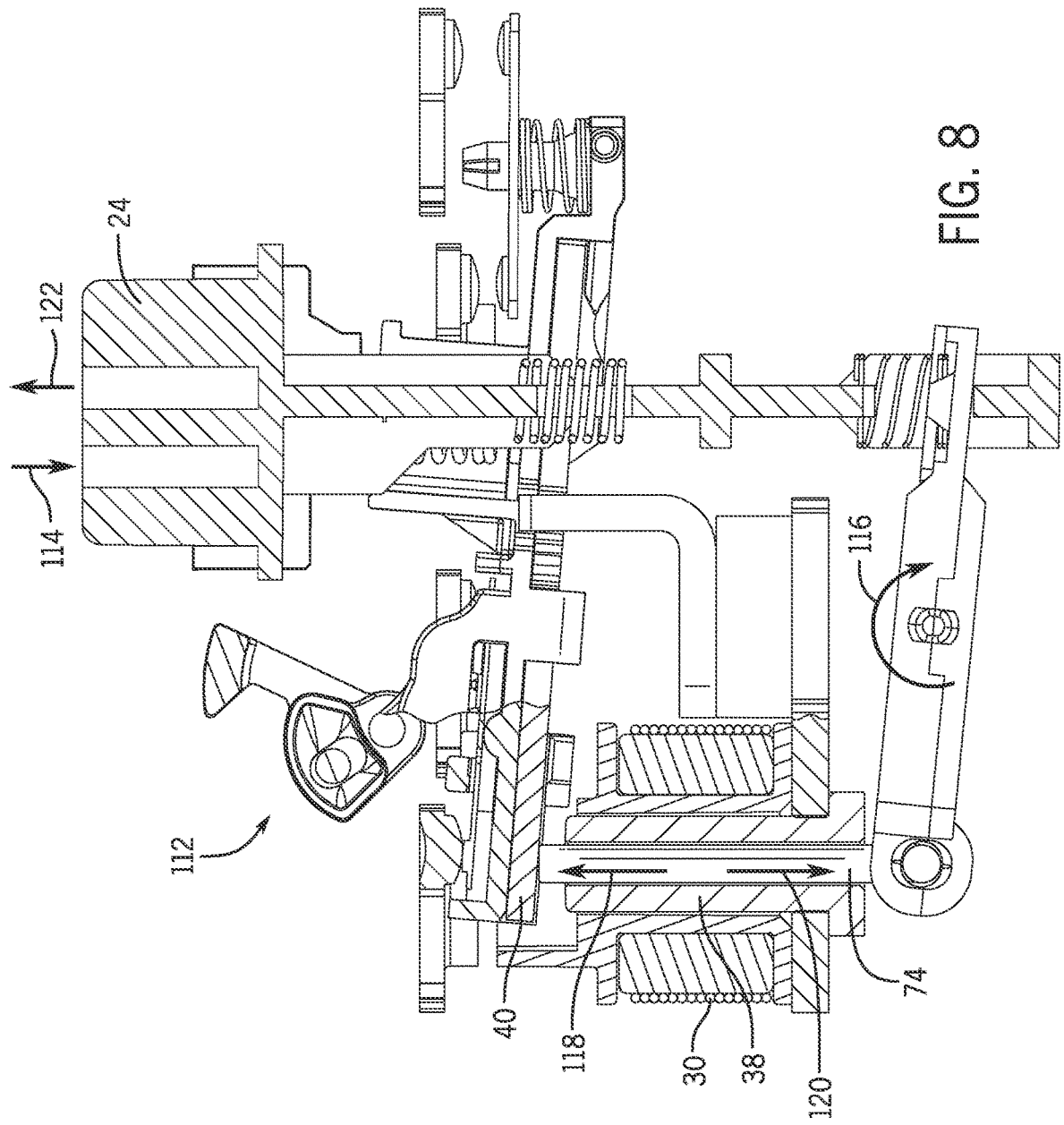
FIG. 8 is a similar illustration showing a trip free reset position.

FIG. 8 illustrates the trip free reset operation of the relay. This operation, indicated generally by reference 112, allows for electromagnetic tripping despite operation of the reset button. In particular, after the reset button is depressed as indicated by arrow 114, lever 64 may pivot, as indicated by arrow 116, and the reset pin 74 will have moved upwardly, as indicated by arrow 118. The reset pin will have magnetically coupled to the armature 40, and the armature will move downwardly with the pin as indicated by arrow 120. (Upon release of the reset button, it will also be moved back upwardly as indicated by arrow 122.) If the coil 30 is energized in the trip direction at any time during this reset process, the reset pin will magnetically decouple from the armature and the toggle spring will trip the relay again. Here again, where desired the coil may be energized to prevent reset. In this manner, electromagnetic operation via the electromagnetic activation path thus overrides resetting by the mechanical activation path.

Figure 9:
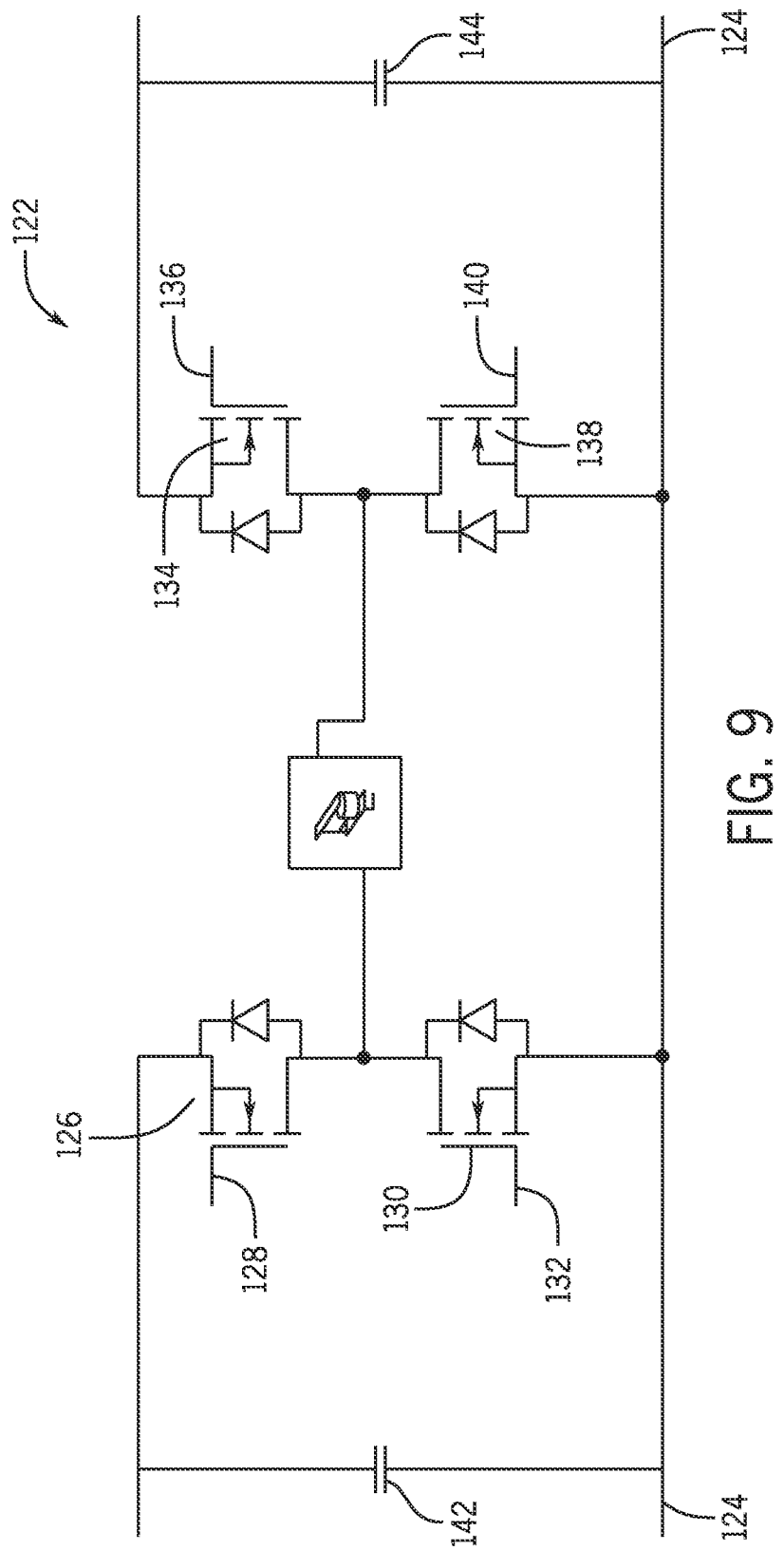
FIG. 9 is a circuit diagram of an exemplary scheme for controlling the overload relay and reducing power needs.

FIG. 9 illustrates exemplary control circuitry 122 for energizing the single coil 30 for both tripping and resetting. The circuitry makes use of an H-bridge design, and pulse width modulation to ensure proper operation of the device, while significantly reducing power requirements. The circuitry 122 will be coupled to a power supply (not separately shown) as indicated by reference numeral 124 to charge storage capacitors 142 and 144. As illustrated, electronic switches (e.g., FETs) are provided that receive control signals from the processing circuitry (not separately shown). A first switch 126 receives control signals at input 128, while a second switch 130 receives control signals at input 132. On opposite side of the coil, a third switch 134 receives control signals at input 136, while fourth switch 138 receives control signals at input 140. For application of current to trip the device in a first polarity, switch 126 is placed in a conductive state, and switch 138 receives a control signal to cause pulse width modulated opening and closing of the switch. For resetting, switches 130 and 134 are powered on. As noted above, the overload relay is bi-stable, meaning that once in the tripped state or the reset state, no power need be applied to the coil. However, if desired, power may be applied by the circuitry of FIG. 9 to ensure that any attractive force of the permanent magnet is overcome to aid in maintaining the coil in the tripped state. Also shown in FIG. 9, each side of the circuitry may include capacitors 142 and 144 that allow for operation of the device for tripping or reset for a limited time in the event that the power supply is temporarily lost.

Figure 10:
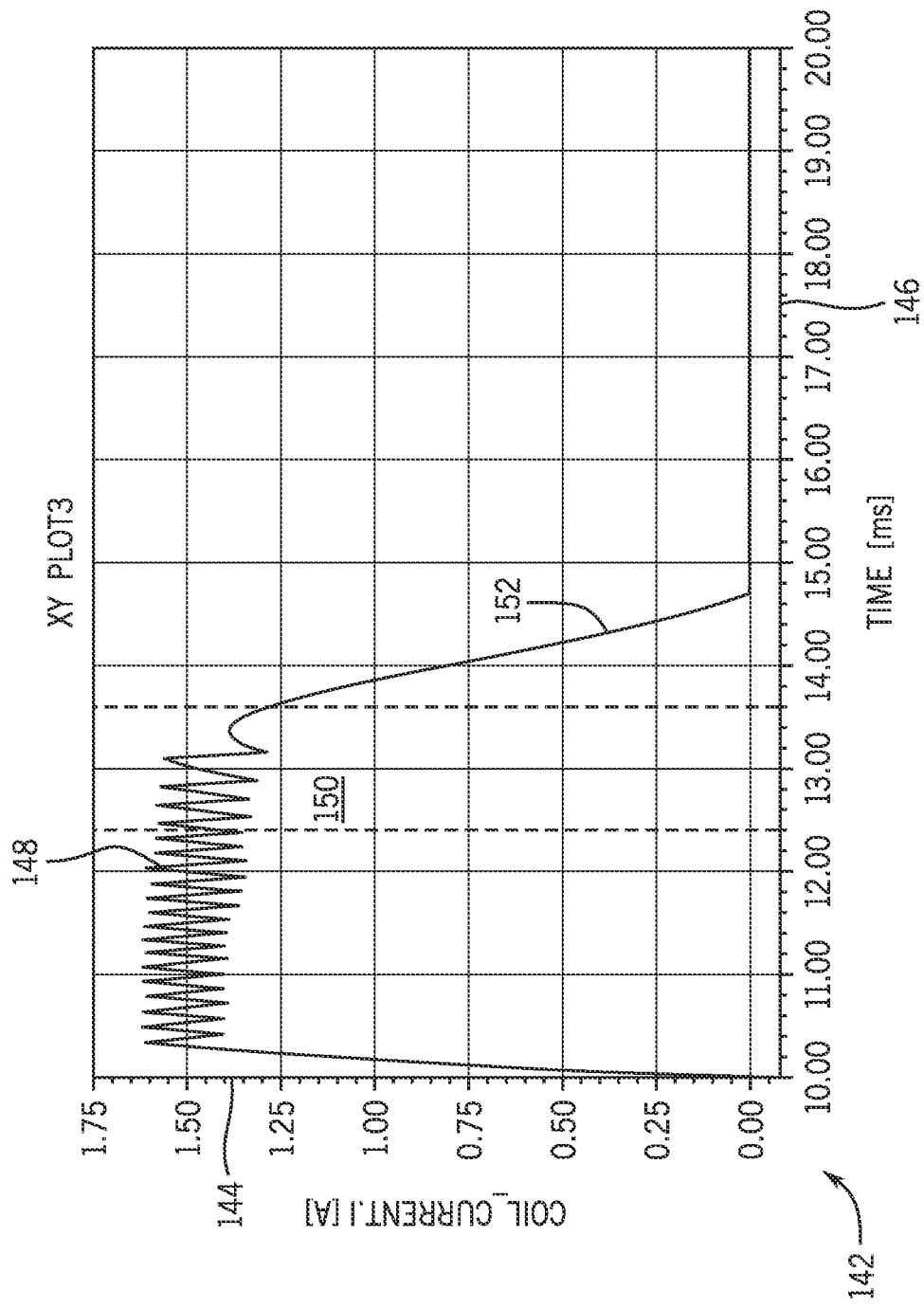
FIG. 10 is a graphical representation of current through the relay operator coil for tripping electromagnetically.

FIG. 10 is a graphical illustration of current applied to the coil for tripping. The graph 142 illustrates current 144 against time 146. When tripping is desired, a pulse width modulated signal is applied to the coil as indicated at reference 148. In the illustrated embodiment, a current of approximately 1.5 A is applied, and the relay opens at a window of time indicated at 150. Thereafter, currently be removed from the coil as indicated by reference 152.

Figure 11:
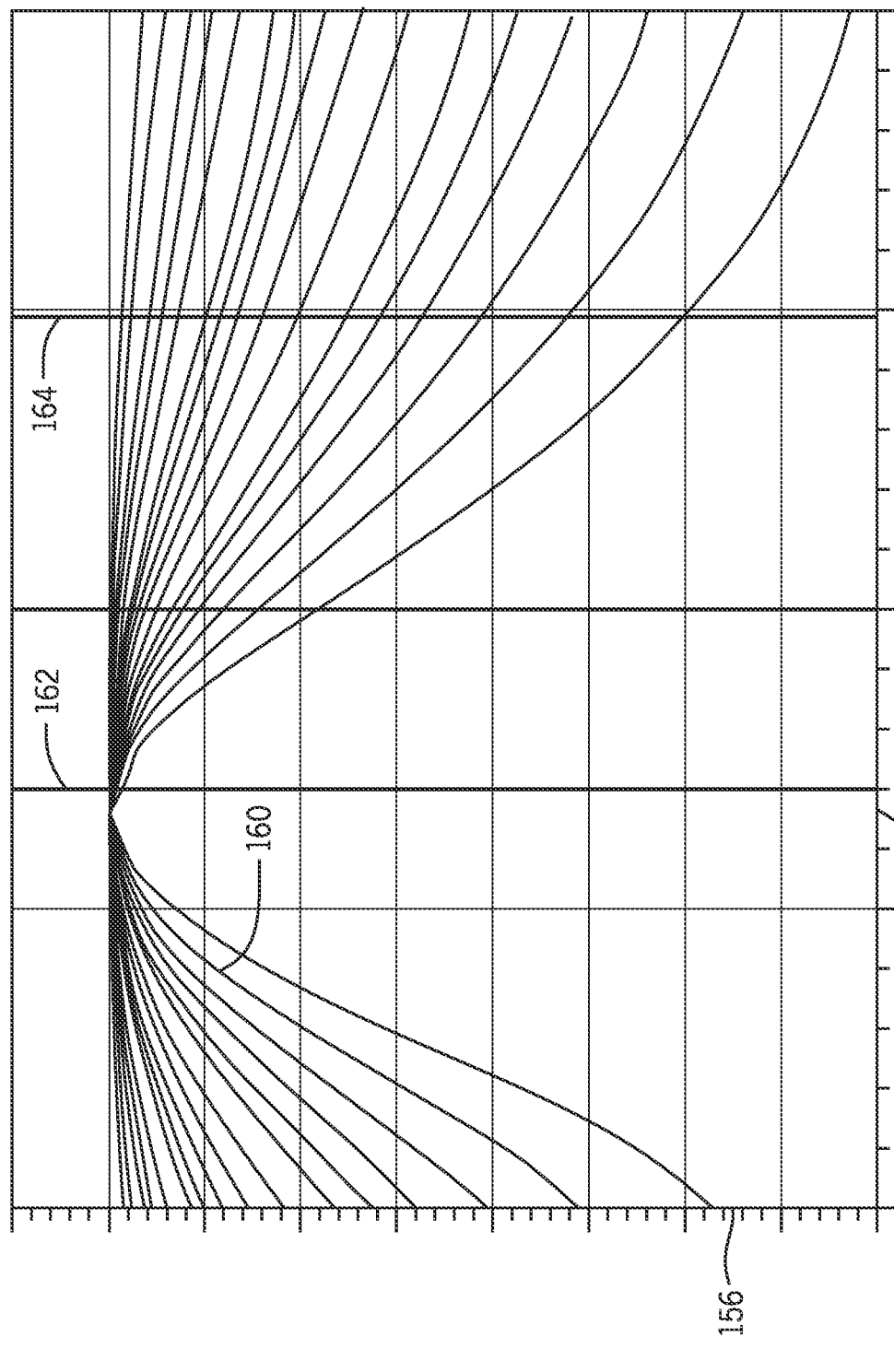
FIG. 11 is a graphical representation of certain coil characteristics that may be considered in specifying a coil for both resetting and tripping functions.

FIG. 11 illustrates exemplary torque versus current relationship for an operator coil for the present overload relay, a consideration for design and selection of the coil. In particular, relationship 154 may be illustrated as a magnetic torque 156 applied to armature (negative torque in relation to positive torque from toggle spring) versus coil current 158 and a series of armature positions or relationships 160 may be considered in the coil design and specification. In certain prior art devices, two separate coils are employed, one for trip and one for reset, whereas in the present embodiments, a single coil is used. A specific amp-turn specification may be provided to deactivate the magnetic coupling. That is, the coil is selected to provide sufficient amp-turns to overcome the toggle spring force. Using a low resistance coil and limiting current through the use of pulse width modulation may reduce relay energy consumption. Use of a single coil also reduces the magnetic path, providing more magnetic force for the same number of magnetic path components. In the illustration of FIG. 11, a minimum magnetic torque 162 may be designed to ensure tripping, while a magnetic torque 164 greater than the torque from the toggle spring allows for resetting.

While only certain features of the invention have been illustrated and described herein, many modifications and changes will occur to those skilled in the art. It is, therefore, to be understood that the appended claims intended to cover all such modifications and changes as fall within the true spirit of the invention.

The invention claimed is:

1. An overload relay, comprising:
   an electromagnetic activation path comprising a single coil and an armature that, in operation, moves movable contacts between set and tripped states with respect to stationary contacts, a magnet to hold the armature in the set state, wherein for tripping, the coil produces a coil magnetic flux to overcome a magnetic flux of the magnet to release the armature to the tripped state under the influence of a spring; and
   a mechanical activation path comprising a manually operated reset member that causes the armature to move between the tripped and set states;
   wherein the electromagnetic activation path and the mechanical activation path can both move the armature between the set and tripped states without selection of a tripping mode of operation; and wherein when the coil is energized to produce the coil magnetic flux to overcome the magnetic flux of magnet, manual operation of the reset member will not cause resetting of the armature to the set state; and
   wherein circuitry is provided comprising a first path through an h-bridge for energizing the coil from tripping, and a second path through the h-bridge for energizing the coil for setting, switches of the h-bridge being independently switched, in operation, by pulse width modulated control signals; and
   wherein control circuitry is provided for remote control of the overload relay under commands from an external device, the control circuitry comprising communications circuitry allowing the overload relay to be networked and receive and/or send data.

2. The overload relay of claim 1, wherein the mechanical activation path comprises a trip prevention spring having characteristics that prevent the reset member overcoming the coil when the coil is energized.

3. The overload relay of claim 2, wherein the spring is disposed in the mechanical activation path between the reset member and a lever that urges tripping of the armature.

4. The overload relay of claim 1, wherein the circuitry is configured for pulse width modulating power to energize the coil at least to trip the relay.

5. The overload relay of claim 1, wherein the external device comprises an automation controller.

6. The overload relay of claim 1, wherein each of the paths comprises a capacitor to permit tripping and setting in case of loss of input power.

7. The overload relay of claim 1, comprising control circuitry coupled to the coil to control energization of the coil, and wherein the control circuitry is configured to de-energize the coil after movement of the armature from the trip state to the set state, and from the set state to the trip state.

8. An overload relay, comprising:
   an armature that, in operation, moves movable contacts between set and tripped states with respect to stationary contacts;
   a magnet that in operation produces a magnet magnetic flux to hold the armature in the set state;
   a single coil energizable in a first manner to attract the armature to the set state, and in a second manner to produce a coil magnetic flux to overcome the magnet magnetic flux to release the armature to the tripped state under the influence of a spring; and
   a mechanical activation path comprising a manually operated reset member that causes the armature to move between the tripped and set states;
   wherein the armature is bistable in the set and tripped states; and
   wherein the electromagnetic activation path and the mechanical activation path can both move the armature between the set and tripped states; and
   wherein when the coil is energized to produce the coil magnetic flux to overcome the magnet, manual operation of the reset member will not cause resetting of the armature to the set state; and
   wherein circuitry is provided comprising a first path through an h-bridge for energizing the coil from tripping, and a second path through the h-bridge for energizing the coil for setting, switches of the h-bridge being independently switched, in operation, by pulse width modulated control signals, and
   wherein control circuitry is provided for remote control of the overload relay under commands from an external device, the control circuitry comprising communications circuitry allowing the overload relay to be networked and receive and/or send data.

9. The relay of claim 8, comprising a spring to maintain the armature in a tripped state.

10. The relay of claim 8, wherein the mechanical activation path comprises a lever and a pin connected to the lever, the lever being moved by the reset member, and the pin extending through the coil to contact the armature upon manual actuation of the reset member.

11. The overload relay of claim 10, wherein the mechanical activation path comprises a trip prevention spring having characteristics that prevent the reset member overcoming the coil when the coil is energized.

12. The overload relay of claim 11, wherein the spring is disposed in the mechanical activation path between the reset member and the lever.

13. The overload relay of claim 8, wherein the control circuitry is coupled to the coil to control energization of the coil, and wherein the control circuitry is configured to de-energize the coil after movement of the armature from the trip state to the set state.

14. The overload relay of claim 13, wherein the control circuitry is configured to de-energize the coil after movement of the armature from the set state to the trip state.

15. An overload relay, comprising:
an electromagnetic activation path comprising a single coil and an armature that, in operation, moves movable contacts between set and tripped states with respect to stationary contacts, a magnet to hold the armature in the set state, and wherein for tripping, the coil produces a coil magnetic flux to overcome a magnet magnetic flux of the magnet to release the armature to the tripped state under the influence of a spring; and
a mechanical activation path comprising a manually operated reset member that causes the armature to move between the tripped and set states;
wherein the armature is bistable in the set and tripped states, and wherein the electromagnetic activation path and the mechanical activation path can both move the armature between the set and tripped states while in the same physical configuration and without selection of a trip mode of operation;
wherein the same stationary contacts may be wired for normally open or normally closed operation; and
wherein circuitry is provided comprising a first path through an h-bridge for energizing the coil from tripping, and a second path through the h-bridge for energizing the coil for setting, switches of the h-bridge being independently switched, in operation, by pulse width modulated control signals, and
wherein control circuitry is provided for remote control of the overload relay under commands from an external device, the control circuitry comprising communications circuitry allowing the overload relay to be networked and receive and/or send data.

16. The overload relay of claim 15, wherein when the coil is energized to overcome the magnet, manual operation of the reset member will not cause resetting of the armature to the set state.

17. The overload relay of claim 16, wherein the mechanical activation path comprises a trip prevention spring having characteristics that prevent the reset member overcoming the coil when the coil is energized.

18. The overload relay of claim 17, wherein the spring is disposed in the mechanical activation path between the reset member and the lever.

19. The overload relay of claim 15, wherein the control circuitry is coupled to the coil to control energization of the coil, and wherein the control circuitry is configured to de-energize the coil after movement of the armature from the trip state to the set state.

20. The overload relay of claim 19, wherein the control circuitry is configured to pulse width modulate energization of the coil to ensure that the magnet is overcome by the coil for electromagnetically tripping the relay.

* * * * *